(12) United States Patent
Kanagawa et al.

(10) Patent No.: US 8,174,844 B2
(45) Date of Patent: May 8, 2012

(54) WIRED CIRCUIT BOARD AND CONNECTION STRUCTURE BETWEEN WIRED CIRCUIT BOARDS

(75) Inventors: Hitoki Kanagawa, Osaka (JP); Akinori Itokawa, Osaka (JP); Naotaka Higuchi, Osaka (JP)

(73) Assignee: NITTO DENKO Corporation, Osaka (JP)

( * ) Notice: Subject to any disclaimer, the term of this patent is extended or adjusted under 35 U.S.C. 154(b) by 40 days.

(21) Appl. No.: 12/654,034

(22) Filed: Dec. 8, 2009

(65) Prior Publication Data

US 2010/0157560 A1 Jun. 24, 2010

Related U.S. Application Data

(60) Provisional application No. 61/193,988, filed on Jan. 15, 2009.

(30) Foreign Application Priority Data

Dec. 18, 2008 (JP) ................................ 2008-322566

(51) Int. Cl.
*H05K 1/11* (2006.01)
(52) U.S. Cl. ......................................................... 361/795
(58) Field of Classification Search .................. 361/795, 361/749–751, 760; 174/250–258, 261
See application file for complete search history.

(56) References Cited

U.S. PATENT DOCUMENTS

| 6,396,665 | B1 | 5/2002 | Asano |
| 6,797,888 | B2 | 9/2004 | Ookawa et al. |
| 7,471,519 | B2 | 12/2008 | Ooyabu et al. |
| 2004/0179306 | A1 | 9/2004 | Kaneko et al. |
| 2004/0245619 | A1 | 12/2004 | Takeuchi et al. |
| 2005/0189645 | A1 | 9/2005 | Nakano et al. |
| 2006/0023435 | A1* | 2/2006 | Ooyabu et al. ................ 361/760 |

FOREIGN PATENT DOCUMENTS

| JP | 11-191210 | 7/1999 |
| JP | 2000-298809 | 10/2000 |
| JP | 2002-093073 | 3/2002 |
| JP | 2002-222578 A | 8/2002 |
| JP | 2004-273968 | 9/2004 |
| JP | 2004-342288 | 12/2004 |
| JP | 2004-363331 | 12/2004 |
| JP | 2005-101041 | 4/2005 |
| JP | 2005-243930 | 9/2005 |
| JP | 2006-40414 A | 2/2006 |

* cited by examiner

*Primary Examiner* — Jeremy Norris
*Assistant Examiner* — Tremesha S Willis
(74) *Attorney, Agent, or Firm* — Jean C. Edwards, Esq.; Edwards Neils PLLC

(57) ABSTRACT

A wired circuit board for electrically connecting a suspension board with circuit comprising a metal supporting layer, an insulating base layer, a conductive layer, and an insulating cover layer, and an external circuit, includes a first wired circuit board electrically connected with the suspension board with circuit; and a second wired circuit board for electrically connecting with the external circuit. The first wired circuit board and the second wired circuit board are electrically connected through a preamplifier. The first wired circuit board includes a first metal supporting layer; a first insulating base layer; a first conductive layer and a first insulating cover layer.

5 Claims, 5 Drawing Sheets

WIRED CIRCUIT BOARD AND CONNECTION STRUCTURE BETWEEN WIRED CIRCUIT BOARDS

CROSS-REFERENCE TO RELATED APPLICATIONS

This patent application claims the benefit of U.S. Provisional Application No. 61/193,988, filed on Jan. 15, 2009, and claims priority from Japanese Patent Application No. 2008-322566, filed on Dec. 18, 2008, the contents of which are herein incorporated by reference in their entirety.

BACKGROUND OF THE INVENTION

1. Field of the Invention

The present invention relates to a wired circuit board and a connection structure between wired circuit boards. More particularly, the present invention relates to a wired circuit board suitably used as a relay flexible wiring circuit board electrically connected to a suspension board with circuit and an external board, and a connection structure between wired circuit boards.

2. Description of Related Art

Conventionally, the relay flexible wiring circuit board has been electrically connected to a suspension board with circuit and an external board to electrically relay them, and used in hard disk drives.

In such relay flexible wiring circuit board, from the viewpoint of transmission efficiency of electrical signals, impedance matching at connection points between the relay flexible wiring circuit board and the suspension board with circuit has been desired and various proposals for matching the impedance have been made.

For example, it has been proposed that a relay flexible wiring circuit board is constructed with two wired circuit boards including a first wired circuit board connected with a suspension board with circuit and mounted with a preamplifier IC and a second wired circuit board connected to the first wired circuit board and to an external board, in which the lamination of the first wired circuit board and the lamination of the suspension board with circuit are made identical (cf. Japanese Unexamined Patent Publication No. 2004-363331).

According to the relay flexible wiring circuit board described in Japanese Unexamined Patent Publication No. 2004-363331, since the lamination of the suspension board with circuit is identical to that of the first wired circuit board, impedance matching at connection points between the suspension board with circuit and the first wired circuit board can be achieved. As a result, electrical signals between a magnetic head mounted on the suspension board with circuit and the preamplifier IC mounted on the first wired circuit board can be efficiently transmitted.

SUMMARY OF THE INVENTION

The first wired circuit board in Japanese Unexamined Patent Publication No. 2004-363331 can be connected with the suspension board with circuit while establishing the impedance matching. However, since the first wired circuit board is also connected with the second wired circuit board, an impedance mismatch occurs at connection points between the first and second wired circuit boards.

Therefore, electrical signals between the magnetic head mounted on the suspension board with circuit and an external circuit are poorly transmitted, thus failing to provide efficient transmission.

It is an object of the present invention to provide a wired circuit board capable of reducing impedance mismatch between the magnetic head and the external circuit.

The wired circuit board of the present invention is a wired circuit board for electrically connecting a suspension board with circuit including a metal supporting layer, an insulating base layer formed on the metal supporting layer, a conductive layer formed on the insulating base layer, and an insulating cover layer formed on the insulating base layer so as to cover the conductive layer, and an external circuit, including a first wired circuit board electrically connected with the suspension board with circuit; and a second wired circuit board for electrically connecting with the external circuit, the first wired circuit board and the second wired circuit board being electrically connected through a preamplifier, the first wired circuit board including a first metal supporting layer; a first insulating base layer formed on the metal supporting layer; a first conductive layer formed on the first insulating base layer; and a first insulating cover layer formed on the first insulating base layer so as to cover the first conductive layer.

In the wired circuit board of the present invention, it is preferable that the conductive layer of the suspension board with circuit and the first conductive layer of the first wired circuit board have substantially the same thickness.

In the wired circuit board of the present invention, it is preferable that the insulating base layer of the suspension board with circuit and the first insulating base layer of the first wired circuit board have substantially the same thickness.

In the wired circuit board of the present invention, it is preferable that the insulating cover layer of the suspension board with circuit and the first insulating cover layer of the first wired circuit board have substantially the same thickness.

The connection structure between wired circuit boards according to the present invention includes a suspension board with circuit; a first wired circuit board; a second wired circuit board; and a preamplifier, the suspension board with circuit including a metal supporting layer, an insulating base layer formed on the metal supporting layer, a conductive layer formed on the insulating base layer, and an insulating cover layer formed on the insulating base layer so as to cover the conductive layer, the conductive layer including a first terminal for electrically connecting with a magnetic head; and a second terminal for electrically connecting with the first wired circuit board, the first wired circuit board including a first metal supporting layer, a first insulating base layer formed on the first metal supporting layer, a first conductive layer formed on the first insulating base layer, and a first insulating cover layer formed on the first insulating base layer so as to cover the first conductive layer, the first conductive layer including a third terminal for electrically connecting with the suspension board with circuit; and a fourth terminal for electrically connecting with the preamplifier, the second wired circuit board including a second conductive layer, the second conductive layer including a fifth terminal for electrically connecting with the preamplifier; and a sixth terminal for electrically connecting with an external circuit, in which the preamplifier is electrically connected between the fourth terminal and the fifth terminal, and the second terminal of the suspension board with circuit and the third terminal of the first wired circuit board are electrically connected to each other.

In the wired circuit board and the connection structure between wired circuit boards according to the present invention, the first wired circuit board has the same lamination as the suspension board with circuit, and the first wired circuit board and the second wired circuit board are not directly connected to each other but electrically connected through the preamplifier.

Therefore, the number of connection points between the first and second wired circuit boards can be reduced more than when the first and second wired circuit boards are directly connected to each other, enabling reduction in impedance mismatch in the wired circuit boards.

As a result, in the wired circuit board of the present invention, the impedance between the magnetic head and the external circuit can be matched.

DETAILED DESCRIPTION OF PREFERRED EMBODIMENTS

Figure 1:
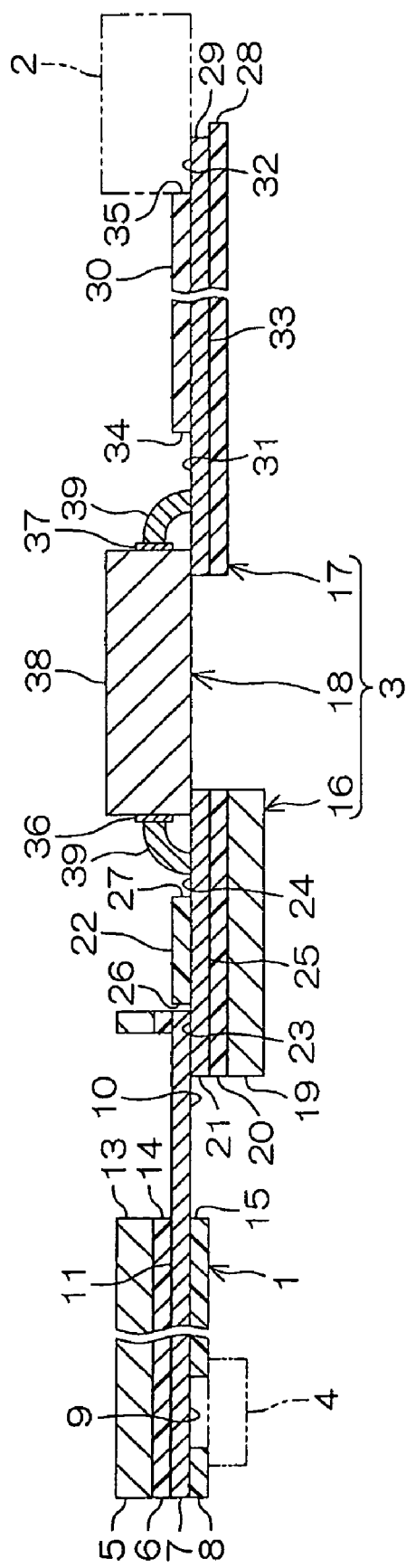
FIG. 1 is a sectional view showing a use condition of a relay flexible wiring circuit as an embodiment of a wired circuit board used for a connection structure between wired circuit boards according to the present invention.

FIG. 1 is a sectional view showing a use condition of a relay flexible wiring circuit as an embodiment of a wired circuit board used for a connection structure between wired circuit boards according to the present invention; and FIG. 2(a) shows a sectional view of the suspension board with circuit alone shown in FIG. 1, FIG. 2(b) shows a sectional view of the first wired circuit board alone shown in FIG. 1, FIG. 2(c) shows a sectional view of the second wired circuit board alone shown in FIG. 1, and FIG. 2(d) shows a sectional view of the relay flexible wiring circuit board alone shown in FIG. 1. In FIG. 2(b), the suspension board with circuit shown in FIG. 1 has been rotated 180 degrees.

In the connection structure between wired circuit boards shown in FIG. 1, a suspension board with circuit 1 arranged on the front side (one side in lengthwise direction) and an external board 2 (indicated by phantom lines) as an external circuit arranged on the rear side (the other side in lengthwise direction) are electrically relayed by a relay flexible wiring circuit board 3.

The suspension board with circuit 1 is mounted with a magnetic head 4 (indicated by phantom lines) on a hard disk drive and supports the magnetic head 4 while holding a minute gap between the magnetic head 4 and a magnetic disk (not shown) against an airflow caused when the magnetic head 4 and the magnetic disk travel relatively to each other.

The suspension board with circuit 1 is integrally formed with a conductive layer 7 electrically connected to the magnetic head 4.

As shown in FIG. 2(a), the suspension board with circuit 1 is formed in the shape of a thin plate extending in the lengthwise direction, and includes a metal supporting layer 5, an insulating base layer 6 formed on the metal supporting layer 5, a conductive layer 7 formed on the insulating base layer 6, and an insulating cover layer 8 formed on the insulating base layer 6 so as to cover the conductive layer 7.

The metal supporting layer 5 is formed in the shape of a generally rectangular flat plate extending in the lengthwise direction, corresponding to the outer shape of the suspension board with circuit 1.

The material that may be used to form the metal supporting layer 5 is a metal foil or a metal thin plate, and includes, for example, stainless steel, copper, aluminum, copper-beryllium, phosphor bronze, and 42-alloy. In consideration of resilience and corrosion resistance, stainless steel is preferable.

The metal supporting layer 5 has a thickness in the range of, for example, 10 to 60 μm, or preferably 15 to 30 μm. The metal supporting layer 5 has a length in the widthwise direction (a direction perpendicular to the lengthwise direction) in the range of, for example, 100 to 500 mm, or preferably 250 to 300 mm.

The insulating base layer 6 is formed on a surface of the metal supporting layer 5 in a pattern corresponding to a portion where the conductive layer 7 is formed.

The insulating material that may be used to form the insulating base layer 6 includes, for example, synthetic resins such as polyimide, polyether nitrile, polyether sulfone, polyethylene terephthalate, polyethylene naphthalate, and polyvinyl chloride. Among them, photosensitive synthetic resin is preferably used, or photosensitive polyimide is more preferably used.

The insulating base layer 6 has a thickness in the range of, for example, 1 to 30 μm, or preferably 2 to 20 μm.

The conductive layer 7 integrally and continuously includes a first terminal 9, a second terminal 10, and a wire 11 for connecting between the first terminal 9 and the second terminal 10.

The wire 11 is provided along the lengthwise direction, and a plurality (e.g., four pieces) of wires 11 are arranged in parallel at spaced intervals to each other in the widthwise direction, though not shown.

The first terminals 9 are arranged in the front end portion of the suspension board with circuit 1 in parallel at spaced intervals to each other along the widthwise direction, though not shown. A plurality (e.g., four pieces) of first terminals 9 are provided so that the front end portions of the respective wires 11 are connected thereto. Terminals (not shown) of the magnetic head 4 are electrically connected to the respective first terminals 9.

The second terminals 10 are arranged in the rear end portion of the suspension board with circuit 1 in parallel at spaced intervals to each other along the widthwise direction, though not shown. A plurality (e.g., four pieces) of second terminals 10 are provided so that the front end portions of the respective wires 11 are connected thereto.

The second terminals 10 are formed as flying leads as described later, each provided with its under surface exposed from the metal supporting layer 5 and the insulating base layer 6, and its upper surface exposed from the insulating cover layer 8.

The conductive material that may be used to form the conductive layer 7 includes metal materials such as copper, nickel, gold, solder, and alloys thereof. Among them, copper is preferably used.

The conductive layer 7 has a thickness in the range of, for example, 1 to 15 µm, or preferably 3 to 12 µm. The width of each wire 11, the width of each first terminal 9, and the width of each second terminal 10 are, for example, the same or different from one another, and each width is in the range of, for example, 50 to 500 µm, or preferably 80 to 300 µm. The spacing between the respective wires 11, the spacing between the respective first terminals 9, and the spacing between the respective second terminals 10 are, for example, the same or different from one another, and each spacing is in the range of, for example, 5 to 500 µm, or preferably 15 to 100 µm. The length (length in lengthwise direction) of each first terminal 9 and the length of each second terminal 10 are, for example, the same or different from each other, and each length is in the range of, for example, 100 to 2000 µm, or preferably, 500 to 1200 µm.

When the conductive layer 7 is formed by an additive method to be described later, a ground layer (not shown) is interposed between each wire 11 and the insulating base layer 6. The ground layer is formed on the under surfaces of the wires 11 and, more specifically, formed in the same pattern as the wires 11. The ground layer has a thickness in the range of, for example, 1 to 6000 nm, or preferably 5 to 5000 nm.

The insulating cover layer 8 is formed on the insulating base layer 6 so as to cover the conductive layer 7.

More specifically, the insulating cover layer 8 is formed in the same pattern as that in the insulating base layer 6 in plane view, and is formed on the insulating base layer 6 including the conductive layer 7 in a predetermined pattern which covers the wires 11 and has an opening in portions corresponding to the first terminals 9.

The insulating material that may be used to form the insulating cover layer 8 includes, for example, the same synthetic resins as used for forming the insulating base layer 6. Among them, photosensitive synthetic resin is preferably used, or photosensitive polyimide is more preferably used.

The insulating cover layer 8 has a thickness in the range of, for example, 1 to 20 µm, or preferably 2 to 10 µm.

In the suspension board with circuit 1, each of the metal supporting layer 5 and the insulating base layer 6 has an opening in a portion corresponding to the second terminals 10, and the insulating cover layer 8 is notched.

More specifically, the metal supporting layer 5 has a metal opening 13 formed in the portion where the second terminals 10 are formed, extending through the metal supporting layer 5 in the thickness direction. The metal opening 13 is opened in a generally rectangular shape in plane view so as to encompass all (e.g., four pieces) of the second terminals 10 in plane view, though not shown.

In addition, the insulating base layer 6 has a base opening 14 formed in the portion where the second terminals 10 are formed, extending through the insulating base layer 6 in the thickness direction. The base opening 14 is opened in the same shape as the metal opening 13 so as to encompass all (e.g., four pieces) of the second terminals 10 in plane view, though not shown. That is, the base opening 14 is formed so that both the lengthwise end edges and both the widthwise end edges thereof are in the same positions in plane view as those lengthwise and widthwise end edges of the metal opening 13.

Thus, the under surfaces of the second terminals 10 are exposed from the metal opening 13 in the metal supporting layer 5 and the base opening 14 in the insulating base layer 6.

Further, the insulating cover layer 8 has a cover notch 15 formed in the portion where the second terminals 10 are formed. The cover notch 15 is flush in the widthwise direction so as to expose all (e.g., four pieces) of the second terminals 10 in plane view, though not shown.

Thus, the second terminals 10 are formed as flying leads so that the surfaces (the upper surface, both side surfaces, and the under surface) thereof are exposed from the metal opening 13 in the metal supporting layer 5, the base opening 14 in the insulating base layer 6, and the cover notch 15 in the insulating cover layer 8.

The suspension board with circuit 1 described above can be produced by a method for producing a known suspension board with circuit.

For example, a metal supporting layer 5 made of stainless steel foil is first prepared.

Then, an insulating base layer 6 is formed on the metal supporting layer 5 in a predetermined pattern. For forming the insulating base layer 6 on the metal supporting layer 5 in a predetermined pattern, for example, a photosensitive synthetic resin solution such as a polyamic acid resin solution is applied onto the metal supporting layer 5. The applied solution is then exposed, developed, and thereafter, heated to be cured.

Subsequently, a conductive layer 7 is formed on the insulating base layer 6 in a predetermined pattern having first terminals 9 and second terminals 10. The conductive pattern 7 is formed by a known patterning method, such as an additive method or a subtractive method. The conductive pattern 7 is formed preferably by an additive method.

In the additive method, a ground layer is first formed on the entire upper surface of the insulating base layer 6. The ground layer is formed by sequentially laminating a thin chromium film and a thin copper film by sputtering, or preferably chromium sputtering and copper sputtering.

Then, in this method, after a plating resist, which is not shown, is formed on the upper surface of the ground layer in a pattern reverse to the pattern of the conductive layer 7, the conductive layer 7 is formed on the upper surface of the ground layer exposed from the plating resist in a predetermined pattern, for example, by electrolytic plating, or preferably, by electrolytic copper plating. Thereafter, the plating resist and the ground layer in the portion where the plating resist is laminated are removed.

Thus, the conductive layer 7 can be formed on the insulating base layer 6 in the above-mentioned pattern having the first terminals 9, the second terminals 10, and the wires 11.

The conductive layer 7 thus formed may be coated with an electroless plated layer of nickel by electroless nickel plating, if necessary.

Then, an insulating cover layer 8 is formed on the insulating base layer 6 including the conductive layer 7 in a predetermined pattern in which a portion corresponding to the first terminals 9 is opened and a portion corresponding to the second terminals 10 is notched. For forming the insulating cover layer 8 on the insulating base layer 6 including the conductive layer 7 in a predetermined pattern, the same method as that used in the formation of the insulating base layer 6 described above can be used. For example, a photosensitive synthetic resin solution such as a polyamic acid resin solution is applied onto the insulating base layer 6 including the conductive layer 7. The applied solution is then exposed, developed, and thereafter, heated to be cured.

Thus, the upper surfaces of the first terminals 9 are exposed from the opening of the insulating cover layer 8, and the upper surfaces and both side surfaces of the second terminals 10 are exposed from the notched portion (cover notch 15) in the insulating cover layer 8.

Then, a metal opening 13 is formed in the metal supporting layer 5. To form the metal opening 13, for example, a known method, such as an etching method including dry etching (e.g., plasma etching) and wet etching (e.g., chemical etching); a drilling method; or a laser processing method, is used. Preferably, chemical etching is used.

Then, a base opening 14 is formed in the insulating base layer 6. To form the base opening 14, for example, a known method, such as an etching method including dry etching (e.g., plasma etching) and wet etching (e.g., chemical etching); a drilling method; or a laser processing method, is used. Preferably, plasma etching is used.

Thus, when the conductive layer 7 is formed by an additive method, the ground layer opposed to the second terminals 10 in the thickness direction is exposed from the metal opening 13 in the metal supporting layer 5 and the base opening 14 in the insulating base layer 6. Then, the ground layer exposed from the metal opening 13 in the metal supporting layer 5 and from the base opening 14 in the insulating base layer 6 is removed.

For removal of the ground layer, for example, a known etching method such as dry etching (e.g., plasma etching) and wet etching (e.g., chemical etching) or a peeling method is used. Preferably, a peeling method is used.

Thus, the under surfaces of the second terminals 10 are exposed from the metal opening 13 in the metal supporting layer 5 and the base opening 14 in the insulating base layer 6.

Thus, the suspension board with circuit 1 can be obtained.

In addition, in the suspension board with circuit 1, though not shown, for example, a gold plating layer may be formed on the surfaces (the upper surface, both side surfaces, and the under surface) of the second terminals 10, so that the second terminals 10 may have an improved mechanical strength. Such gold plating layer is formed, for example, by electrolytic gold plating or electroless gold plating, or preferably by electrolytic gold plating.

As shown in FIG. 1, a relay flexible wiring circuit board 3 includes a first wired circuit board 16 electrically connected with the suspension board with circuit 1, a second wired circuit board 17 electrically connected to an external board 2, and a preamplifier 18 electrically connecting between the first and second wired circuit boards 16 and 17.

As shown in FIG. 2(b), the first wired circuit board 16 is formed in the shape of a thin plate extending in the lengthwise direction, and includes a first metal supporting layer 19, a first insulating base layer 20 formed on the first metal supporting layer 19, a first conductive layer 21 formed on the first insulating base layer 20, and a first insulating cover layer 22 formed on the first insulating base layer 20 so as to cover the first conductive layer 21.

The first metal supporting layer 19 is formed in the shape of a generally rectangular flat plate extending in the lengthwise direction, corresponding to the outer shape of the first wired circuit board 16.

The material that may be used to form the first metal supporting layer 19 is a metal foil or a metal thin plate, which is the same material as used for forming the metal supporting board 5 of the suspension board with circuit 1, and includes, for example, stainless steel, copper, aluminum, copper-beryllium, phosphor bronze, and 42-alloy. In consideration of resilience and corrosion resistance, stainless steel is preferably used.

The thickness of the first metal supporting layer 19 is the same as that of the metal supporting layer 5 of the suspension board with circuit 1, and is in the range of, for example, 10 to 60 µm, or preferably 15 to 30 µm. The first metal supporting layer 19 has a width in the range of, for example, 100 to 500 mm, or preferably 250 to 300 mm.

The first insulating base layer 20 is formed on the surface of the first metal supporting layer 19 in a pattern corresponding to a portion where the first conductive layer 21 is formed.

The insulating material that may be used to form the first insulating base layer 20 is the same material as used for forming the insulating base layer 6 of the suspension board with circuit 1, and includes, for example, synthetic resins such as polyimide, polyether nitrile, polyether sulfone, polyethylene terephthalate, polyethylene naphthalate, and polyvinyl chloride. Among them, photosensitive synthetic resin is preferably used, or photosensitive polyimide is more preferably used.

The thickness of the first insulating base layer 20 is the same as that of the insulating base layer 6 of the suspension board with circuit 1, and is in the range of, for example, 1 to 30 µm, or preferably 2 to 20 µm.

The first conductive layer 21 integrally and continuously includes a third terminal 23, a fourth terminal 24, and a first wire 25 for connecting between the third terminal 23 and the fourth terminal 24.

The first wire 25 is provided along the lengthwise direction, and a plurality (e.g., four pieces) of first wires 25 are arranged in parallel at spaced intervals to each other in the widthwise direction, though not shown.

The third terminals 23 are arranged in the front end portion of the first wired circuit board 16 in parallel at spaced intervals to each other along the widthwise direction, though not shown. A plurality (e.g., four pieces) of third terminals 23 are provided so that the front end portions of the respective first wires 25 are connected thereto.

The fourth terminals 24 are arranged in the rear end portion of the first wired circuit board 16 in parallel at spaced intervals to each other along the widthwise direction, though not shown. A plurality (e.g., four pieces) of fourth terminals 24 are provided so that the front end portions of the respective first wires 25 are connected thereto.

The third terminals 23 and the fourth terminals 24 are provided so that the upper surfaces thereof are exposed from the first insulating cover layer 22, as described later.

The conductive material that may be used to form the first conductive layer 21 is the same material as used for forming the conductive layer 7 of the suspension board with circuit 1, and includes, for example, metal materials such as copper, nickel, gold, solder, or alloys thereof. Among them, copper is preferably used.

The thickness of the first conductive layer 21 is the same as that of the conductive layer 7 of the suspension board with circuit 1, and is in the range of, for example, 1 to 15 µm, or preferably 3 to 12 µm. The width of each first wire 25, the width of each third terminal 23, and the width of each fourth terminal 24 are, for example, the same or different from one another, and each width is in the range of, for example, 50 to 500 µm, or preferably 80 to 300 µm. The spacing between the respective first wires 25, the spacing between the respective third terminals 23, and the spacing between the respective fourth terminals 24 are, for example, the same or different from one another, and each spacing is in the range of, for example, 5 to 500 µm, or preferably 15 to 100 µm. The length (length in lengthwise direction) of each third terminal 23 and the length of each fourth terminal 24 are, for example, the same or different from each other, and each length is in the range of, for example, 100 to 2000 µm, or preferably, 500 to 1200 µm.

When the first conductive layer 21 is formed by an additive method to be described later, a ground layer (not shown) is interposed between the first conductive layer 21 and the first insulating base layer 20. The ground layer is formed on the under surface of the first conductive layer 21, and more specifically, formed in the same pattern as the first conductive layer 21. The thickness of the ground layer is the same as that of the ground layer in the suspension board with circuit 1, and is in the range of, for example, 1 to 6000 nm, or preferably 5 to 5000 nm.

The first insulating cover layer 22 is formed on the first insulating base layer 20 so as to cover the first conductive layer 21.

More specifically, the first insulating cover layer 22 is formed in the same pattern as that in the first insulating base layer 20 in plane view, and is formed on the first insulating base layer 20 including the first conductive layer 21 in a predetermined pattern which covers the first wires 25 and expose the third terminals 23 and the fourth terminals 24.

The insulating material that may be used to form the first insulating cover layer 22 is the same material as used for forming the insulating cover layer 8 of the suspension board with circuit 1, and includes, for example, the same synthetic resins as used for forming the first insulating base layer 20. Among them, photosensitive synthetic resin is preferably used, or photosensitive polyimide is more preferably used.

The thickness of the first insulating cover layer 22 is the same as that of the insulating cover layer 8 of the suspension board with circuit 1, and is in the range of, for example, 1 to 20 μm, or preferably 2 to 10 μm.

In the first wired circuit board 16, the first insulating cover layer 22 is notched in the portion corresponding to the third terminals 23 and the fourth terminals 24.

More specifically, the first insulating cover layer 22 has a first notch in the first cover 26 formed in the portion where the third terminals 23 are formed, and a second notch in the first cover 27 formed in the portion where the fourth terminals 24 are formed.

The first notch in the first cover 26 is flush in the widthwise direction so as to expose all (e.g., four pieces) of the third terminals 23 in plane view, though not shown. Further, the second notch in the first cover 27 is flush in the widthwise direction so as to expose all (e.g., four pieces) of the fourth terminals 24 in plane view, though not shown. Therefore, the upper surfaces of the third and fourth terminals 23 and 24 are exposed.

The first wired circuit board 16 described above can be produced by a method for producing a known wired circuit board, and specifically, produced in the same manner as the production of the suspension board with circuit 1 described above.

For example, a first metal supporting layer 19 made of stainless steel foil is first prepared.

Then, a first insulating base layer 20 is formed on the first metal supporting layer 19 in a predetermined pattern. For forming the first insulating base layer 20 on the first metal supporting layer 19 in a predetermined pattern, for example, a photosensitive synthetic resin solution such as a polyamic acid resin solution is applied onto the first metal supporting layer 19. The applied solution is then exposed, developed, and thereafter, heated to be cured.

Subsequently, a first conductive layer 21 is formed on the first insulating base layer 20 in a predetermined pattern having third terminals 23 and fourth terminals 24. The first conductive layer 21 is formed by a known patterning method, such as an additive method or a subtractive method. The first conductive layer 21 is formed preferably by an additive method.

In the additive method, a ground layer is first formed on the entire upper surface of the first insulating base layer 20. The ground layer is formed by sequentially laminating a thin chromium film and a thin copper film by sputtering, or preferably chromium sputtering and copper sputtering.

Then, in this method, after a plating resist, which is not shown, is formed on the upper surface of the ground layer in a pattern reverse to the pattern of the first conductive layer 21, the first conductive layer 21 is formed on the upper surface of the ground layer exposed from the plating resist in a predetermined pattern, for example, by electrolytic plating, or preferably, by electrolytic copper plating. Thereafter, the plating resist and the ground layer in the portion where the plating resist is laminated are removed.

Thus, the first conductive layer 21 can be formed on the first insulating base layer 20 in the above-mentioned pattern having the third terminals 23, the fourth terminals 24, and the first wires 25.

The first conductive layer 21 thus formed may be coated with an electroless plated layer of nickel by electroless nickel plating, if necessary. Then, a first insulating cover layer 22 is formed on the first insulating base layer 20 including the first conductive layer 21 in a predetermined pattern in which a portion corresponding to the third terminals 23 and the fourth terminals 24 is notched. For forming the first insulating cover layer 22 on the first insulating base layer 20 including the first conductive layer 21 in a predetermined pattern, the same method as that used in the formation of the first insulating base layer 20 described above can be used. For example, a photosensitive synthetic resin solution such as a polyamic acid resin solution is applied onto the first insulating base layer 20 including the first conductive layer 21. The applied solution is then exposed, developed, and thereafter, heated to be cured.

Thus, the upper surfaces and both the side surfaces of the third and fourth terminals 23 and 24 are exposed from the notched portions (first notch in the first cover 26 and second notch in the first cover 27) in the first insulating cover layer 22.

Thus, the first wired circuit board 16 can be obtained.

The second wired circuit board 17 is a flexible wiring circuit board, which is formed in the shape of a thin plate extending in the lengthwise direction as shown in FIG. 2(c), and includes a second insulating base layer 28, a second conductive layer 29 formed on the second insulating base layer 28, and a second insulating cover layer 30 formed on the second insulating base layer 28 so as to cover the second conductive layer 29.

The second insulating base layer 28 is formed in the shape of a generally rectangular flat plate extending in the lengthwise direction, corresponding to the outer shape of the second wired circuit board 17.

The second insulating base layer 28 is formed in a pattern corresponding to a portion where the second conductive layer 29 is formed.

The insulating material that may be used to form the second insulating base layer 28 includes, for example, synthetic resins such as polyimide, polyether nitrile, polyether sulfone, polyethylene terephthalate, polyethylene naphthalate, and polyvinyl chloride. Among them, photosensitive synthetic resin is preferably used, or photosensitive polyimide is more preferably used.

The second insulating base layer 28 has a thickness in the range of, for example, 1 to 30 μm, or preferably 2 to 20 μm.

The second conductive layer 29 integrally and continuously includes a fifth terminal 31, a sixth terminal 32, and a second wire 33 for connecting the fifth terminal 31 and the sixth terminal 32.

The second wire 33 is provided along the lengthwise direction, and a plurality (e.g., four pieces) of second wires 33 are arranged in parallel at spaced intervals to each other in the widthwise direction, though not shown.

The fifth terminals 31 are arranged in the front end portion of the second wired circuit board 17 in parallel at spaced intervals to each other along the widthwise direction, though not shown. A plurality (e.g., four pieces) of fifth terminals 31 are provided so that the front end portions of the respective second wires 33 are connected thereto.

The sixth terminals 32 are arranged in the rear end portion of the second wired circuit board 17 in parallel at spaced intervals to each other along the widthwise direction, though not shown. A plurality (e.g., four pieces) of sixth terminals 32 are provided so that the front end portions of the respective second wires 33 are connected thereto.

The fifth terminals 31 and the sixth terminals 32 are provided so that the upper surfaces thereof are exposed from the second insulating cover layer 30, as described later.

The conductive material that may be used to form the second conductive layer 29 includes, for example, metal materials such as copper, nickel, gold, solder, or alloys thereof. Among them, copper is preferably used.

The second conductive layer 29 has a thickness in the range of, for example, 1 to 15 μm, or preferably 3 to 12 μm. The width of each second wire 33, the width of each fifth terminal 31, and the width of each sixth terminal 32 are, for example, the same or different from one another, and each width is in the range of, for example, 50 to 500 μm, or preferably 80 to 300 μm. The spacing between the respective second wires 33, the spacing between the respective fifth terminals 31, and the spacing between the respective sixth terminals 32 are, for example, the same or different from one another, and each spacing is in the range of, for example, 5 to 500 μm, or preferably 15 to 100 μm. The length (length in lengthwise direction) of each fifth terminal 31 and the length of each sixth terminal 32 are, for example, the same or different from each other, and each length is in the range of, for example, 100 to 2000 μm, or preferably, 500 to 1200 μm.

When the second conductive layer 29 is formed by an additive method to be described later, the ground layer (not shown) is interposed between the second conductive layer 29 and the second insulating base layer 28. The ground layer is formed on the under surface of the second conductive layer 29, and more specifically, formed in the same pattern as the second conductive layer 29. The ground layer has a thickness in the range of, for example, 1 to 6000 nm, or preferably 5 to 5000 nm.

The second insulating cover layer 30 is formed on the second insulating base layer 28 so as to cover the second conductive layer 29.

More specifically, the second insulating cover layer 30 is formed in the same pattern as that in the second insulating base layer 28 in plane view, and is formed on the second insulating base layer 28 including the second conductive layer 29 in a predetermined pattern which covers the second wires 33 and expose the fifth terminals 31 and the sixth terminals 32.

The insulating material that may be used to form the second insulating cover layer 30 includes, for example, the same synthetic resins as used for forming the second insulating base layer 28. Among them, photosensitive synthetic resin is preferably used, or photosensitive polyimide is more preferably used.

The second insulating cover layer 30 has a thickness in the range of, for example, 1 to 20 μm, or preferably 2 to 10 μm.

In the second wired circuit board 17, the second insulating cover layer 30 is notched in the portion corresponding to the fifth terminals 31 and the sixth terminals 32.

More specifically, the second insulating cover layer 30 has a first notch in the second cover 34 formed in the portion where the fifth terminals 31 are formed, and a second notch in the second cover 35 formed in the portion where the sixth terminals 32 are formed.

The first notch in the second cover 34 is flush in the widthwise direction so as to expose all (e.g., four pieces) of the fifth terminals 31 in plane view, though not shown. Further, the second notch in the second cover 35 is flush in the widthwise direction so as to expose all (e.g., four pieces) of the sixth terminals 32 in plane view, though not shown. Therefore, the upper surfaces of the fifth and sixth terminals 31 and 32 are exposed.

The second wired circuit board 17 described above can be produced by a method for producing a known relay flexible wiring circuit board.

For example, a second insulating base layer 28 made of a film formed in the outer shape of the second wired circuit board 17 is first prepared. Then, a second conductive layer 29 is formed on the second insulating base layer 28 in a predetermined pattern having fifth terminals 31, sixth terminals 32, and second wires 33.

The second conductive layer 29 is formed by a known patterning method, such as an additive method or a subtractive method. The second conductive layer 29 is formed preferably by the subtractive method.

In the subtractive method, a two-layer substrate made of metal foil, which is laminated on the upper surface of the second insulating base layer 28, if necessary, via an adhesive layer, is first prepared.

Then, in this method, an etching resist is formed on a surface of the metal foil in the same pattern as that in the second conductive layer 29 described above. The etching resist is formed by a known method using a dry film photoresist or the like.

Thereafter, the metal foil exposed from the etching resist is etched, and the etching resist is then removed by etching or peeling.

Thus, the second conductive layer 29 can be formed on the second insulating base layer 28 in the above-mentioned pattern having the fifth terminals 31, the sixth terminals 32, and the second wires 33.

The second conductive layer 29 thus formed may be coated with an electroless plated layer of nickel by electroless nickel plating, if necessary.

Then, a second insulating cover layer 30 is formed on the second insulating base layer 28 including the second conductive layer 29 in a predetermined pattern in which a portion corresponding to the fifth terminals 31 and the sixth terminals 32 is notched. For forming the second insulating cover layer 30 on the second insulating base layer 28 including the second conductive layer 29 in a predetermined pattern, for example, a photosensitive synthetic resin solution such as a polyamic acid resin solution is applied onto the second insulating base layer 28 including the second conductive layer 29. The applied solution is then exposed, developed, and thereafter, heated to be cured.

Thus, the upper surfaces and both the side surfaces of the fifth and sixth terminals 31 and 32 are exposed from the notched portions (first notch in the second cover 34 and second notch in the second cover 35) in the second insulating cover layer 30.

Thus, the second wired circuit board 17 can be obtained.

As shown in FIG. 2(d), the relay flexible wiring circuit board 3 is formed by electrically connecting the above-mentioned first and second wired circuit boards 16 and 17 through the preamplifier 18.

The preamplifier 18 includes a seventh terminal 36, an eighth terminal 37, and a preamplifier body 38 to which the seventh terminal 36 and the eighth terminal 37 are connected. The preamplifier body 38 is made of an amplifier for electrical signals.

The seventh terminal 36 is provided in the front end portion of the preamplifier body 38, and the eighth terminal 37 is provided in the rear end portion of the preamplifier body 38.

To electrically connect the first wired circuit board 16 and the second wired circuit board 17 with the preamplifier 18, the first wired circuit board 16 and the second wired circuit board 17 are opposed in spaced relation to each other in the lengthwise direction, and the preamplifier 18 is arranged between the rear end portion (the end portion where the fourth terminals 24 are formed) of the first wired circuit board 16 and the front end portion (the end portion where the fifth terminals 31 are formed) of the second wired circuit board 17.

More specifically, each of the side end portions (the one side end portion where the seventh terminal 36 is formed and the other side end portion where the eighth terminal 37 is formed) of the preamplifier 18 in the lengthwise direction is placed on the rear end portion of the first wired circuit board 16 and on the front end portion of the second wired circuit board 17.

Subsequently, using wires 39 made of conductive material such as copper, nickel, and gold, the seventh terminal 36 of the preamplifier 18 and the fourth terminal 24 of the first wired circuit board 16 are electrically connected to each other and the eighth terminal 37 of the preamplifier 18 and the fifth terminal 31 of the second wired circuit board 17 are electrically connected to each other.

Thus, the relay flexible wiring circuit board 3 can be obtained.

In the relay flexible wiring circuit board 3 thus obtained, the preamplifier 18 electrically connects between the first wired circuit board 16 and the second wired circuit board 17 to amplify electrical signals therebetween, to thereby transmit the amplified electrical signals.

In this relay flexible wiring circuit board 3, as shown in FIG. 1, the third terminals 23 of the first wired circuit board 16 and the second terminals 10 of the suspension board with circuit 1 are electrically connected to each other. Therefore, the suspension board with circuit 1 and the relay flexible wiring circuit board 3 are electrically connected to each other.

In the connection structure thus obtained, as shown in FIG. 1, the first terminals 9 of the suspension board with circuit 1 and the terminals of the magnetic head 4 are electrically connected to each other, and the sixth terminals 32 of the second wired circuit board 17 in the relay flexible wiring circuit board 3 and the terminals of the external board 2 are electrically connected to each other.

Then, in such relay flexible wiring circuit board 3 and the connection structure, the first wired circuit board 16 has the same lamination as that of the suspension board with circuit 1. Therefore, at the connection points between the suspension board with circuit 1 and the first wired circuit board 16, the impedance can be matched.

The first wired circuit board 16 and the second wired circuit board 17 are not directly connected to each other but electrically connected through the preamplifier 18.

Therefore, the number of connection points between the first and second wired circuit boards 16 and 17 can be reduced less than when the first wired circuit board 16 and the second wired circuit board 17 are directly connected to each other, so that the impedance mismatch in the relay flexible wiring circuit board 3 (between the first and second wired circuit boards 16 and 17) can be reduced.

As a result, in the relay flexible wiring circuit board 3 and the connection structure, the impedance between the magnetic head 4 and the external board 2 can be matched.

Figure 3:
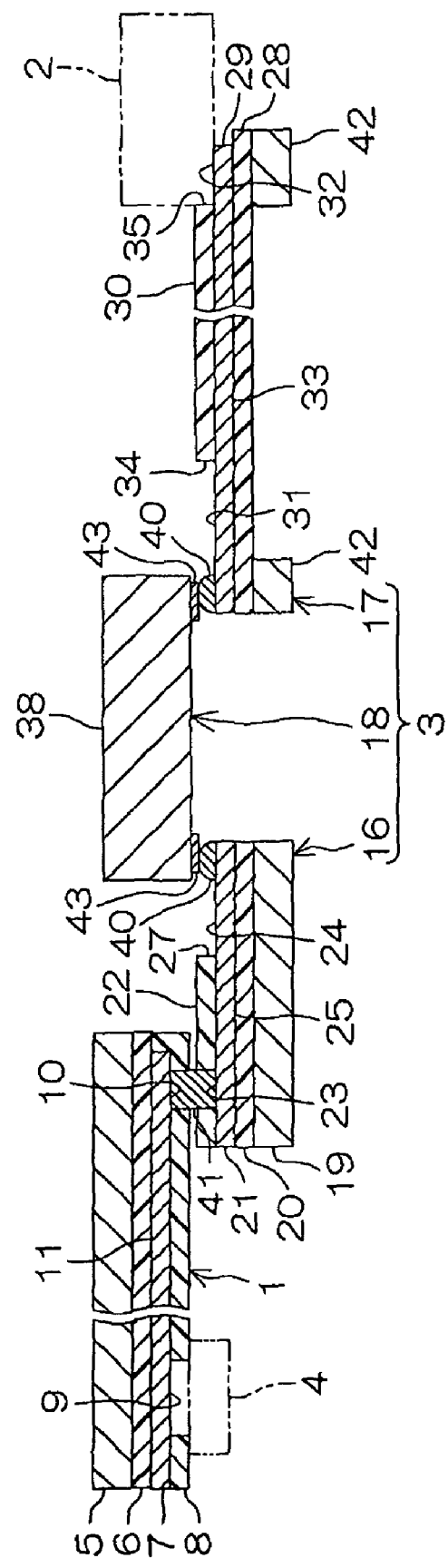
FIG. 3 is a sectional view showing a use condition of a relay flexible wiring circuit as another embodiment of a wired circuit board according to the present invention.

FIG. 3 is a sectional view showing a use condition of a relay flexible wiring circuit as another embodiment of a wired circuit board according to the present invention. The same reference numerals are used in FIG. 3 for the portions corresponding to those described above, and the detailed description thereof is omitted.

In the above description, the wires 39 are used to connect between the seventh terminal 36 of the preamplifier 18 and the fourth terminal 24 of the first wired circuit board 16, and to connect between the eighth terminal 37 of the preamplifier 18 and the fifth terminal 31 of the second wired circuit board 17. However, the connection method is not limited thereto and, for example, as shown in FIG. 3, a known connection method such as a soldered connection with solder 40 may be used. In such case, a soldered connection terminal 43 is appropriately formed on the under surface of the preamplifier 18.

Further, in the above description, the second terminals 10 of the suspension board with circuit 1 are formed as flying leads. However, the second terminals 10 may be formed with only the upper surfaces thereof exposed from the insulating cover layer 8. In addition, the connection between the second and third terminals 10 and 23 is not limited thereto and, for example, a known connection method such as a soldered connection with solder 41 may be used.

Further, in the above description, the second wired circuit board 17 is formed by the second insulating base layer 28, the second conductive layer 29, and the second insulating cover layer 30. However, as shown in FIG. 3, the second wired circuit board 17 may be provided with a stiffener board 42 in portions opposed to the fifth terminals 31 and the sixth terminals 32 in the second insulating base layer 28, if necessary, via an adhesive layer (not shown) in order to assure the strength during bonding.

EXAMPLES

While in the following, the present invention is described in further detail with reference to Example and Comparative Examples, the present invention is not limited to any of them.

Example 1

(1) Production of Suspension Board with Circuit

A metal supporting layer 5 made of a stainless steel foil having a width of 300 mm and a thickness of 20 µm was prepared. Subsequently, a photosensitive polyamic acid resin solution (varnish) was coated on the surface of the metal supporting layer 5 and then dried. The coated resin was exposed to light via a photomask, heated after the exposure, developed using an alkaline developer, and heated to be cured, thereby forming an insulating base layer 6 made of polyimide resin having a thickness of 10 µm.

Next, a thin chromium film having a thickness of 300 Å and a thin copper film having a thickness of 700 Å were sequentially formed over the entire insulating base layer 6 by sputter deposition method, thereby forming a thin conductive film (ground layer).

Thereafter, a plating resist was formed on the thin conductive film in a reversed pattern of a conductive layer 7 using a dry film resist, and the conductive layer 7 having a thickness of 10 μm was then formed on the thin conductive film exposed from the plating resist by electrolytic copper plating. Subsequently, the plating resist was removed by wet etching, and the metal thin film in the portion on which the plating resist was formed was then removed by peeling.

Thus, the conductive layer 7 was formed between the front and rear end portions thereof in a pattern including a plurality of wires 11 formed on the insulating base layer 6, a plurality of first terminals 9 formed on the insulating base layer 6 in the front end portion, and a plurality of second terminals 10 formed on the insulating base layer 6 in the rear end portion.

Each of the second terminals 10 had a length of 500 μm and a width of 100 μm. The spacing between the second terminals 10 in the widthwise direction was 30 μm.

Subsequently, a photosensitive polyamic acid resin solution (varnish) was coated on the insulating base layer 6 so as to cover the conductive layer 7 and then dried. The coated resin was exposed to light via a photomask, developed using an alkaline developer, and heated to be cured, thereby forming an insulating cover layer 8 made of polyimide resin having a thickness of 4 μm.

The insulating cover layer 8 had an opening formed in the front end portion thereof, the opening exposing the first terminals 9, and a notch (cover notch 15) formed in the rear end portion thereof, the notch exposing the second terminals 10, and was formed in a pattern which covers the wires 11 between the front and rear end portions thereof.

Next, a metal opening 13 was formed by subjecting the metal supporting layer 5 to chemical etching, and a base opening 14 was formed by subjecting the insulating base layer 6 to plasma etching. Then, the thin conductive film (ground layer) exposed from the metal opening 13 and the base opening 14 was removed by peeling, thereby forming the second terminals 10 as flying leads exposed from the metal supporting layer 5 and the insulating base layer 6.

Figure 2:
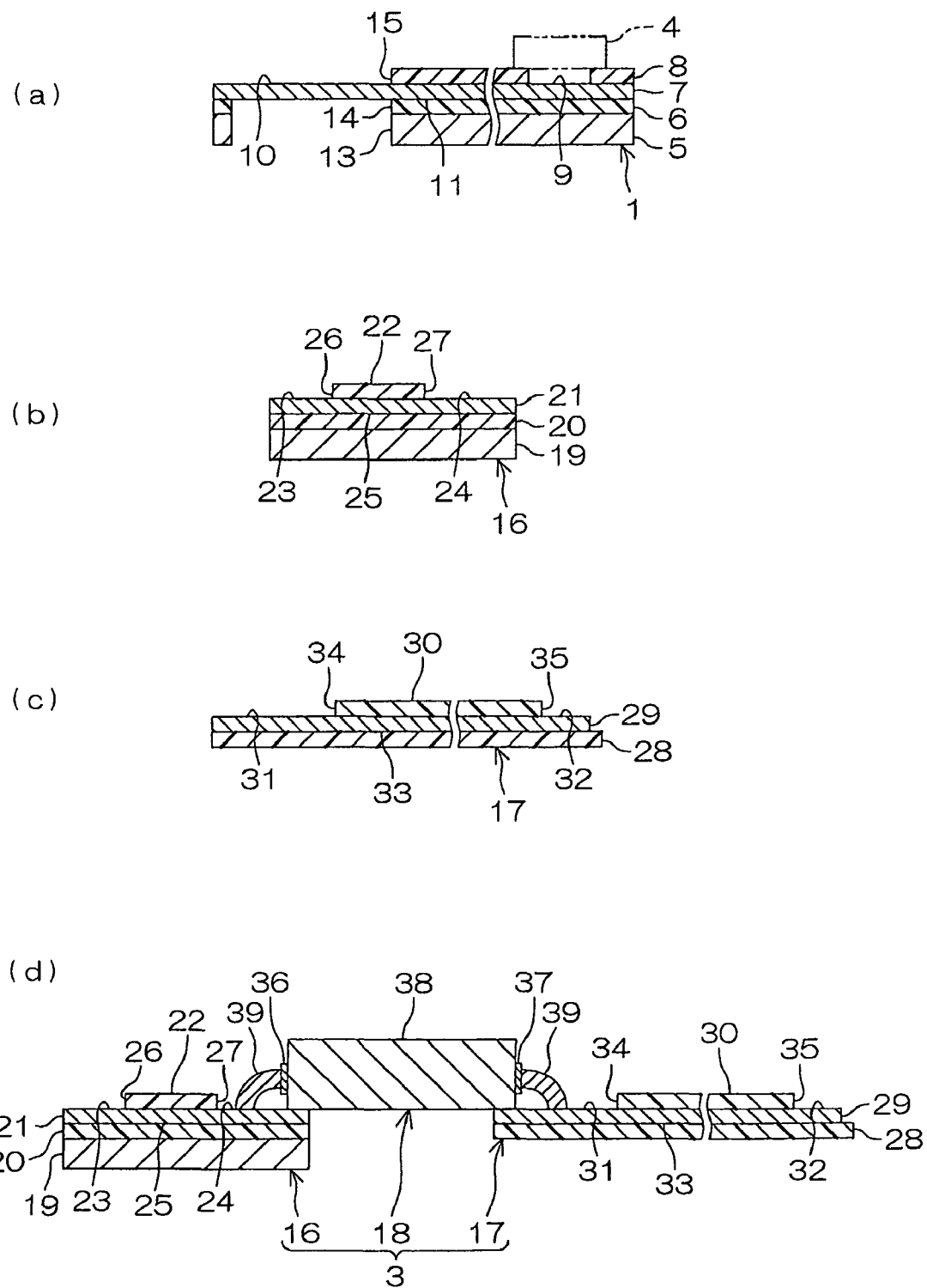
FIG. 2 is a disassembled and sectional view showing the use condition of the wired circuit board shown in FIG. 1, (a) showing a sectional view of the suspension board with circuit alone shown in FIG. 1, (b) showing a sectional view of the first wired circuit board alone shown in FIG. 1 and rotated 180 degrees, (c) showing a sectional view of the second wired circuit board alone shown in FIG. 1, and (d) showing a sectional view of the relay flexible wiring circuit board alone shown in FIG. 1.

Thereafter, the second terminals 10 exposed from the metal supporting layer 5, the insulating base layer 6, and the insulating cover layer 8 were sequentially subjected to electroless nickel plating and electroless gold plating, thereby forming a metal plating layer having a thickness of 2 μm made of a nickel plating layer and a gold plating layer, to obtain a suspension board with circuit 1 (cf. FIG. 2(*a*)).

(2) Production of Relay Flexible Wiring Circuit Board (Production of First Wired Circuit Board)

A first metal supporting layer 19 made of a stainless steel foil having a width of 300 mm and a thickness of 20 μm was prepared. Subsequently, a photosensitive polyamic acid resin solution (varnish) was coated on the surface of the first metal supporting layer 19 and then dried. The coated resin was exposed to light via a photomask, heated after the exposure, developed using an alkaline developer, and heated to be cured, thereby forming a first insulating base layer 20 made of polyimide resin having a thickness of 10 μm.

Next, a thin chromium film having a thickness of 300 Å and a thin copper film having a thickness of 700 Å were sequentially formed over the entire surface of first insulating base layer 20 by sputter deposition method, thereby forming a thin conductive film (ground layer).

Thereafter, a plating resist was formed on the thin conductive film in a reversed pattern of a first conductive layer 21 using a dry film resist, and the first conductive layer 21 having a thickness of 10 μm was then formed on the thin conductive film exposed from the plating resist by electrolytic copper plating. Subsequently, the plating resist was removed by wet etching, and the metal thin film in the portion on which the plating resist was formed was then removed by peeling.

Thus, the first conductive layer 21 was formed between the front and rear end portions thereof in a pattern including a plurality of first wires 25 formed on the first insulating base layer 20, a plurality of third terminals 23 formed on the first insulating base layer 20 in the front end portion thereof, and a plurality of fourth terminals 24 formed on the first insulating base layer 20 in the rear end portion thereof.

Subsequently, a photosensitive polyamic acid resin solution (varnish) was coated on the first insulating base layer 20 so as to cover the first conductive layer 21 and then dried. The coated resin was exposed to light via a photomask, developed using an alkaline developer, and heated to be cured, thereby forming a first insulating cover layer 22 made of polyimide resin having a thickness of 4 μm.

The first insulating cover layer 22 had a notch (first notch in the first cover 26) formed in the front end portion thereof, the notch exposing the third terminals 23, and a notch (second notch in the first cover 27) formed in the rear end portion thereof, the notch exposing the fourth terminals 24, and was formed in a pattern which covers the first wires 25 between the front and rear end portions thereof. Thus, a first wired circuit board 16 was obtained (cf. FIG. 2(*b*)).

Each of the third terminals 23 had a length of 700 μm and a width of 100 μm. The spacing between the third terminals 23 in the widthwise direction was 30 μm.

Each of the fourth terminals 24 had a length of 1000 μm and a width of 200 μm. The spacing between the fourth terminals 24 in the widthwise direction was 80 μm.

(Production of Second Wired Circuit Board)

A two-layer substrate having a 10-μm-thick copper foil laminated on a second insulating base layer 28 made of a polyimide film having a width of 300 mm and a thickness of 20 μm was prepared.

Subsequently, an etching resist having a thickness of 10 μm was formed on the copper foil of the two-layer substrate in a pattern corresponding to the second conductive layer 29, and a metal foil exposed from the etching resist was then etched. Thereafter, the etching resist was removed by peeling.

Thus, the second conductive layer 29 was formed between the front and rear end portions thereof in a pattern including a plurality of second wires 33 formed on the second insulating base layer 28, a plurality of fifth terminals 31 formed on the second insulating base layer 28 in the front end portion thereof, and a plurality of sixth terminals 32 formed on the second insulating base layer 28 in the rear end portion thereof.

Subsequently, a photosensitive polyamic acid resin solution (varnish) was coated on the second insulating base layer 28 so as to cover the second conductive layer 29 and then dried. The coated resin was exposed to light via a photomask, developed using an alkaline developer, and heated to be cured, thereby forming a second insulating cover layer 30 made of polyimide resin having a thickness of 4 μm.

The second insulating cover layer 30 had a notch (first notch in the second cover 34) formed in the front end portion thereof, the notch exposing the fifth terminals 31, and a notch (second notch in the second cover 35) formed in the rear end portion thereof, the notch exposing the sixth terminals 32, and was formed in a pattern which covers the second wires 33 between the front and rear end portions thereof. Thus, a second wired circuit board was obtained (cf. FIG. 2(*c*)).

Each of the fifth terminals 31 had a length of 1000 μm and a width of 200 μm. The spacing between the fifth terminals 31 in the widthwise direction was 80 μm.

(Connection Between First and Second Wired Circuit Boards)

A preamplifier 18 including a preamplifier body 38, a seventh terminal 36 formed in the front end portion of the preamplifier body 38, and an eighth terminal 37 formed in the rear end portion of the preamplifier body 38 was prepared.

The first wired circuit board 16 and the second wired circuit board 17 were opposed to each other in the lengthwise direction at a spaced interval of 1.5 mm therebetween, and the front and rear end portions of the preamplifier body 38 (having a length of 3 mm) were placed in the rear end portion of the first wired circuit board 16 and in the front end portion of the second wired circuit board 17, respectively. Subsequently, using wires 39 made of copper, the seventh terminal 36 of the preamplifier 18 and the fourth terminal 24 of the first wired circuit board 16 were electrically connected to each other, while the eighth terminal 37 of the preamplifier 18 and the fifth terminal 31 of the second wired circuit board 17 were electrically connected to each other.

Thus, a relay flexible wiring circuit board 3 having the first wired circuit board 16 and the second wired circuit board 17 electrically connected through the preamplifier 18 was obtained (cf. FIG. 2(*d*)).

(3) Connection Among Suspension Board with Circuit, Relay Flexible Wiring Circuit Board, and Control Circuit Board The second terminals 10 (flying lead terminals) of the suspension board with circuit 1 were electrically connected to the third terminals 23 of the first wired circuit board 16 (cf. FIG. 1), and terminals of the control circuit board (external board 2) were electrically connected to the sixth terminals 32 of the second wired circuit board 17. Subsequently, the terminals of the magnetic head 4 were electrically connected to the first terminals 9 of the suspension board with circuit 1.

Comparative Example 1

Figure 4:
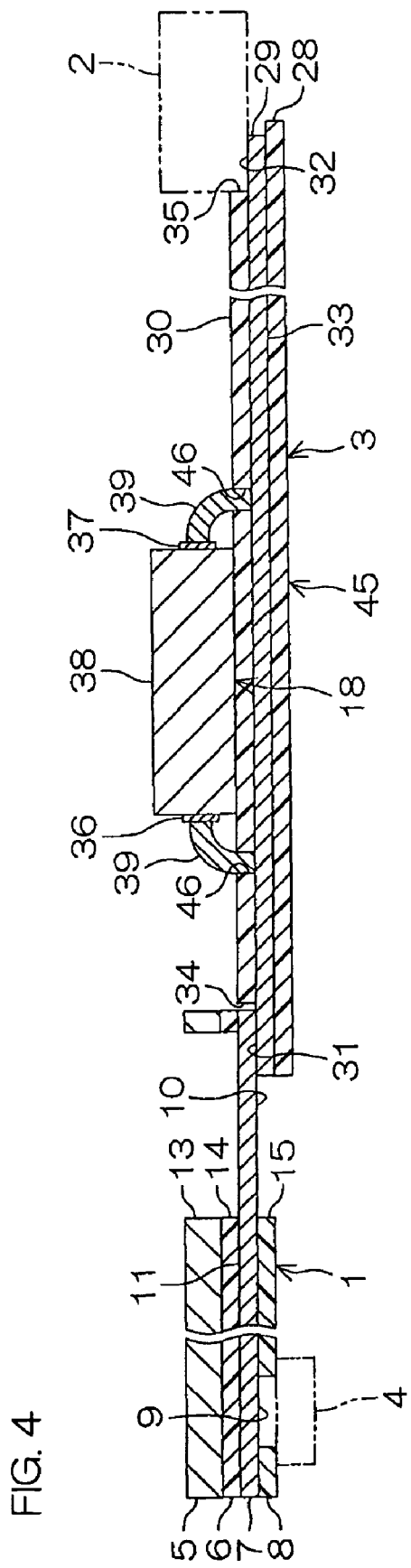
FIG. 4 is a sectional view showing the suspension board with circuit and the relay flexible wiring circuit board in Comparative Example 1.

The suspension board with circuit and the relay flexible wiring circuit board in Comparative Example 1 are shown in FIG. 4. The same reference numerals are used in FIG. 4 for the portions corresponding to those described above, and the detailed description thereof is omitted.

Comparative Example 1 is described below with reference to FIG. 4.

In the same manner as in the production of the suspension board with circuit in Example 1, the suspension board with circuit 1 including the metal supporting layer 5 having a width of 300 mm and a thickness of 20 μm, the insulating base layer 6 having a thickness of 10 μm, the conductive layer 7 having a thickness of 10 μm, and the insulating cover layer 8 having a thickness of 4 μm was produced.

In the suspension board with circuit 1 of Comparative Example 1, as shown in FIG. 4, the second terminals 10 were formed as flying leads.

Subsequently, in the same manner as in the production of the second wired circuit board in Example 1, a wired circuit board 45 including the insulating base layer 28 having a width of 300 mm and a thickness of 20 μm, the conductive layer 29 having a thickness of 10 μm, and the insulating cover layer 35 having a thickness of 4 μm was produced and was then served as the relay flexible wiring circuit board 3.

In the relay flexible wiring circuit board 3 of Comparative Example 1, an opening 46 for electrically connecting between the wired circuit board 45 and the preamplifier 18 was formed in the insulating cover layer 35, and the second conductive layer 29 and the preamplifier 18 were electrically connected through the wires 39.

Thereafter, in the same manner as in Example 1, the suspension board with circuit 1, the relay flexible wiring circuit board 3, and the control circuit board 2 were electrically connected to one another, and the suspension board with circuit 1 and the magnetic head 4 were electrically connected to each other.

Comparative Example 2

Figure 5:
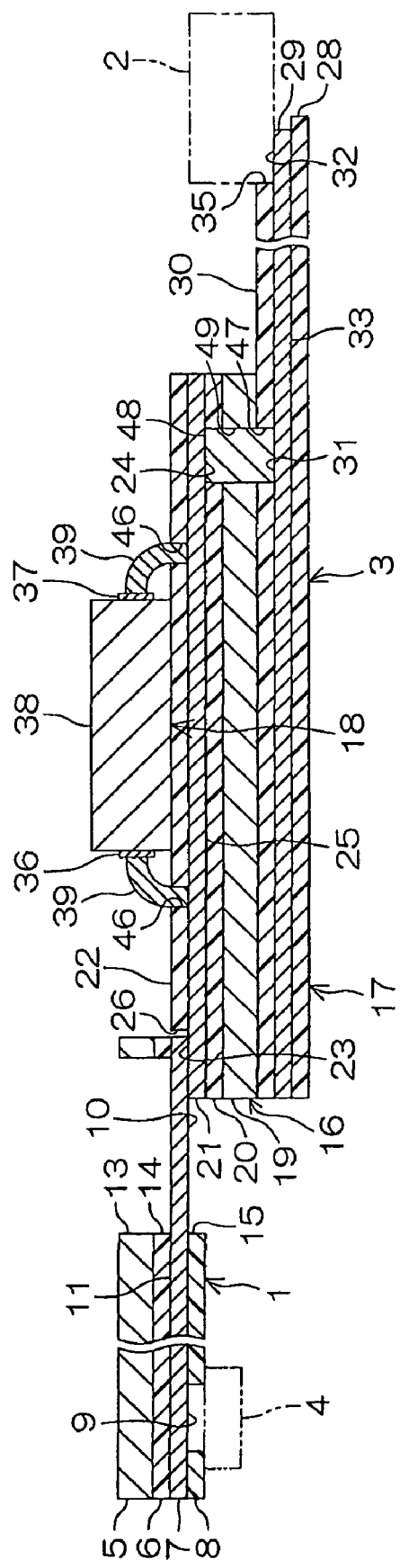
FIG. 5 is a sectional view showing the suspension board with circuit and the relay flexible wiring circuit board in Comparative Example 2.

The suspension board with circuit and the relay flexible wiring circuit board in Comparative Example 2 are shown in FIG. 5. The same reference numerals are used in FIG. 5 for the portions corresponding to those described above, and the detailed description thereof is omitted.

Comparative Example 2 is described below with reference to FIG. 5.

In the same manner as in the production of the suspension board with circuit in Example 1, the suspension board with circuit 1 including the metal supporting layer 5 having a width of 300 mm and a thickness of 20 μm, the insulating base layer 6 having a thickness of 10 μm, the conductive layer 7 having a thickness of 10 μm, and the insulating cover layer 8 having a thickness of 4 μm was produced.

In the suspension board with circuit 1 of Comparative Example 2, as shown in FIG. 5, the second terminals 10 were formed as flying leads.

Subsequently, in the same manner as in the production of the first wired circuit board in Example 1, the first wired circuit board 16 including the first metal supporting layer 19 having a width of 300 mm and a thickness of 20 μm, the first insulating base layer 20 having a thickness of 10 μm, the first conductive layer 21 having a thickness of 10 μm, and the first insulating cover layer 22 having a thickness of 10 μm was produced.

In the first wired circuit board 16 of Comparative Example 2, an opening 46 for electrically connecting between the first wired circuit board 16 and the preamplifier 18 was formed in the first insulating cover layer 22, and the first conductive layer 21 and the preamplifier 18 were electrically connected through the wires 39. Further, a through hole 49 for electrically connecting between the first wired circuit board 16 and the second wired circuit board 17 was formed in the first metal supporting layer 19 and in the first insulating base layer 20 by chemical etching and plasma etching.

Subsequently, in the same manner as in the production of the second wired circuit board in Example 1, the second wired circuit board 17 including the second insulating base layer 28 having a width of 300 mm and a thickness of 20 μm, the second conductive layer 29 having a thickness of 10 μm, and the second insulating cover layer 30 having a thickness of 4 μm was produced.

In the second wired circuit board 17 of Comparative Example 2, an opening 47 for electrically connecting between the first wired circuit board 16 and the second wired circuit board 17 was formed in place of the first notch in the second cover 27.

Next, the relay flexible wiring circuit board 3 was obtained by electrically connecting between the first wired circuit board 16 and the second wired circuit board 17 via solder 48.

Thereafter, in the same manner as in Example 1, the suspension board with circuit 1, the relay flexible wiring circuit board 3, and the control circuit board 2 were electrically connected to one another, and the suspension board with circuit 1 and the magnetic head 4 were electrically connected to each other.

(Evaluation)

(Impedance Measurement)

In the suspension board with circuit and the relay flexible wiring circuit board in Example and Comparative Examples, the impedance matching characteristics at connection points between the suspension board with circuit and the relay flexible wiring circuit board, at connection points (output signals) between the relay flexible wiring circuit board and the front end side of the preamplifier, and at connection points (input signals) between the rear end side of the preamplifier and the relay flexible wiring circuit board were evaluated by time-domain reflectometry (TDR).

The results are shown in Table 1.

TABLE 1

| | Impedance Matching Characteristics | | |
|---|---|---|---|
| | Suspension Board with Circuit/ Relay Flexible Wiring Circuit Board | Relay Flexible Wiring Circuit Board/ Front End Side of Preamplifier (Output Signal) | Relay Flexible Wiring Circuit Board/ Rear End Side of Preamplifier (Input Signal) |
| Ex. 1 | A | A | B |
| Comp. Ex. 1 | B | B | B |
| Comp. Ex. 2 | A | A | C |

According to the impedance evaluation in Table 1, "A" indicates that the impedance is well matched; "B" indicates that impedance matching is difficult; and "C" indicates that the impedance is mismatched.

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board for electrically connecting a suspension board with circuit comprising a metal supporting layer, an insulating base layer formed on the metal supporting layer, a conductive layer formed on the insulating base layer, and an insulating cover layer formed on the insulating base layer so as to cover the conductive layer, and an external circuit, comprising:
a first wired circuit board electrically connected with the suspension board with circuit; and
a second wired circuit board for electrically connecting with the external circuit, the second wired circuit board being separate and distinct from the first wired circuit board, such that the second wired circuit board is spaced apart from the first wired circuit board so as to form a gap therebetween,
the first wired circuit board and the second wired circuit board are directly connected to a preamplifier so that the first wired circuit board and the second wired circuit board are not directly connected to each other, thereby being electrically connected through the preamplifier, the preamplifier being disposed on the first and second wired circuit boards so as to bridge the gap therebetween,
the first wired circuit board comprising:
a first metal supporting layer;
a first insulating base layer formed on the metal supporting layer;
a first conductive layer formed on the first insulating base layer; and
a first insulating cover layer formed on the first insulating base layer so as to cover the first conductive layer.

2. The wired circuit board according to claim 1, wherein the conductive layer of the suspension board with circuit and the first conductive layer of the first wired circuit board have substantially the same thickness.

3. The wired circuit board according to claim 1, wherein the insulating base layer of the suspension board with circuit and the first insulating base layer of the first wired circuit board have substantially the same thickness.

4. The wired circuit board according to claim 1, wherein the insulating cover layer of the suspension board with circuit and the first insulating cover layer of the first wired circuit board have substantially the same thickness.

5. A connection structure between wired circuit boards, comprising:
a suspension board with circuit;
a first wired circuit board;
a second wired circuit board, the second wired circuit board being separate and distinct from the first wired circuit board, such that the second wired circuit board is spaced apart from the first wired circuit board so as to form a gap therebetween; and
a preamplifier, the preamplifier being disposed on the first and second wired circuit boards so as to bridge the gap therebetween,
the suspension board with circuit comprising a metal supporting layer, an insulating base layer formed on the metal supporting layer, a conductive layer formed on the insulating base layer, and an insulating cover layer formed on the insulating base layer so as to cover the conductive layer,
the conductive layer comprising a first terminal for electrically connecting with a magnetic head; and a second terminal for electrically connecting with the first wired circuit board,
the first wired circuit board comprising a first metal supporting layer, a first insulating base layer formed on the first metal supporting layer, a first conductive layer formed on the first insulating base layer, and a first insulating cover layer formed on the first insulating base layer so as to cover the first conductive layer, the first conductive layer comprising a third terminal for electrically connecting with the suspension board with circuit; and a fourth terminal for electrically connecting with the preamplifier, the second wired circuit board comprising a second conductive layer, the second conductive layer comprising a fifth terminal for electrically connecting with the preamplifier; and a sixth terminal for electrically connecting with an external circuit, wherein the preamplifier is directly connected to the fourth terminal and the fifth terminal so that the first wired circuit board and the second wired circuit board are not directly connected to each other, thereby being electrically connected with the first wired circuit board and the second wired circuit board, and the second terminal of the suspension board with circuit and the third terminal of the first wired circuit board are electrically connected to each other.

* * * * *